(12) United States Patent
Chittibabu et al.

(10) Patent No.: US 9,515,274 B2
(45) Date of Patent: Dec. 6, 2016

(54) PHOTOVOLTAIC CELLS

(71) Applicant: Merck Patent GmbH, Darmstadt (DE)

(72) Inventors: Kethinni G. Chittibabu, Westford, MA (US); Nirupama Kattamuri, Lowell, MA (US); Franz Rene Kogler, Fuerth (DE); David P. Waller, Lexington, MA (US); Allesandro Zedda, Andover, MA (US)

(73) Assignee: MERCK PATENT GMBH, Darmstadt (DE)

( * ) Notice: Subject to any disclaimer, the term of this patent is extended or adjusted under 35 U.S.C. 154(b) by 49 days.

(21) Appl. No.: 13/954,606

(22) Filed: Jul. 30, 2013

(65) Prior Publication Data

US 2014/0026964 A1    Jan. 30, 2014

Related U.S. Application Data

(63) Continuation of application No. PCT/US2012/021717, filed on Jan. 18, 2012.

(60) Provisional application No. 61/439,122, filed on Feb. 3, 2011.

(51) Int. Cl.
| | |
|---|---|
| *H01L 31/044* | (2014.01) |
| *H01L 51/42* | (2006.01) |
| *B82Y 10/00* | (2011.01) |
| *H01L 31/032* | (2006.01) |
| *H01L 27/30* | (2006.01) |
| *H01L 51/00* | (2006.01) |

(52) U.S. Cl.
CPC ......... *H01L 51/4213* (2013.01); *B82Y 10/00* (2013.01); *H01L 51/4253* (2013.01); *H01L 51/4273* (2013.01); *H01L 27/301* (2013.01); *H01L 31/0322* (2013.01); *H01L 51/0003* (2013.01); *H01L 51/0036* (2013.01); *H01L 51/0047* (2013.01); *Y02E 10/549* (2013.01)

(58) Field of Classification Search
CPC ....... H01L 31/00–31/078; Y02E 10/50–10/60
USPC .................................................. 136/243–265
See application file for complete search history.

(56) References Cited

U.S. PATENT DOCUMENTS

| | | | |
|---|---|---|---|
| 2004/0256001 A1 | 12/2004 | Mitra et al. | |
| 2005/0098205 A1 | 5/2005 | Roscheisen et al. | |
| 2007/0219375 A1* | 9/2007 | Fujiyama ............... | B82Y 10/00 546/278.7 |

(Continued)

FOREIGN PATENT DOCUMENTS

| | | |
|---|---|---|
| DE | 10 2005 003 846 | 10/2005 |
| JP | H0590623 | 4/1993 |

(Continued)

OTHER PUBLICATIONS

PCT/US2012/021717 Written Opinion, Jan. 18, 2012, Patent Cooperation Treaty.

(Continued)

*Primary Examiner* — Bach Dinh
(74) *Attorney, Agent, or Firm* — Bowditch & Dewey, LLP; Roger P. Zimmerman (57) ABSTRACT

This disclosure features an article that includes first and second electrodes, a photoactive layer between the first and second electrodes, and a hole carrier layer between the first electrode and the photoactive layer. The hole carrier layer includes a Cu(I)-containing material. The article is configured as a photovoltaic cell.

2 Claims, 2 Drawing Sheets

(56) References Cited

U.S. PATENT DOCUMENTS

| | | | |
|---|---|---|---|
| 2007/0264488 A1* | 11/2007 | Lee | 428/323 |
| 2009/0163343 A1* | 6/2009 | Yamashita et al. | 501/43 |
| 2009/0194167 A1* | 8/2009 | Brabec | 136/261 |
| 2009/0229670 A1* | 9/2009 | Kitamura | C07D 213/57 |
| | | | 136/263 |
| 2010/0101643 A1* | 4/2010 | Takahashi et al. | 136/256 |

FOREIGN PATENT DOCUMENTS

| | | |
|---|---|---|
| JP | H09148597 | 6/1997 |
| JP | 2002270861 | 9/2002 |
| JP | 2006013097 | 1/2006 |
| JP | 2007273984 | 10/2007 |
| JP | 2009529792 | 8/2009 |
| JP | 2009537994 | 10/2009 |
| JP | 2000285976 | 10/2010 |
| WO | WO2007104039 | 9/2007 |

OTHER PUBLICATIONS

English translation of the Office Action dated Jun. 28, 2016 in the corresponding Japanese application JP2013-552544.

Office Action dated Oct. 27, 2015 in the corresponding Japanese application JP2013-552544.

* cited by examiner

PHOTOVOLTAIC CELLS

CROSS REFERENCE TO RELATED APPLICATION

This application is a continuation of co-pending international patent application PCT/US2012/021717, filed Jan. 18, 2012, and claims the benefit of U.S. Provisional Application Ser. No. 61/439,122, filed Feb. 3, 2011, under 35 U.S.C. §119(e); the contents of both applications are hereby incorporated by reference.

TECHNICAL FIELD

This disclosure relates to photovoltaic cells, as well as related components, systems, and methods.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material. As a result, the ability of one or both of the electrodes to transmit light (e.g., light at one or more wavelengths absorbed by a photoactive material) can limit the overall efficiency of a photovoltaic cell. In many photovoltaic cells, a film of a semiconductive material (e.g., indium tin oxide) is used to form the electrode(s) through which light passes because, although the semiconductive material can have a lower electrical conductivity than electrically conductive materials, the semiconductive material can transmit more light than many electrically conductive materials.

SUMMARY

This disclosure is based on the unexpected discovery that a Cu(I)-containing material can be used to replace a conventional acidic hole carrier material (e.g., poly(3,4-ethylenedioxythiophene (PEDOT) doped with polystyrene sulfonate (PSS)) to provide a photovoltaic cell with a sufficiently high energy conversion efficiency. The photovoltaic cell thus formed includes a non-acidic hole carrier material and therefore can have an improved stability and life span compared to a conventional photovoltaic cell containing an acidic hole carrier material.

In one aspect, this disclosure features an article that includes first and second electrodes, a photoactive layer between the first and second electrodes, and a hole carrier layer between the first electrode and the photoactive layer. The hole carrier layer includes a Cu(I)-containing material. The article is configured as a photovoltaic cell.

In another aspect, this disclosure features an article that includes first and second electrodes, and a layer between the first and second electrodes. The layer includes a Cu(I)-containing material. The article is configured as a photovoltaic cell.

Embodiments can include one or more of the following features.

In some embodiments, the Cu(I)-containing material includes a Cu(I) oxide. For example, the Cu(I) oxide can include $Cu_2O$ or $Cu_xO$, in which x is a number greater than 1 and less than 2.

In some embodiments, the Cu(I)-containing material includes a Cu(I) salt. The Cu(I) salt can include $Cu_2S$, $Cu_2Se$, $Cu_2Te$, CuSCN, CuSeCN, or a combination thereof.

In some embodiments, the Cu(I)-containing material is in the form of nanoparticles. The nanoparticles can have an average diameter of at least about 2 nm and/or at most about 200 nm.

In some embodiments, the hole carrier layer further includes a binder. The binder can include a polymer or a sol gel. The polymer can include an acrylic resin, an ionic polymer, or a polymer containing an electron accepting group. The sol gel can be formed from a p-type sol, which can include vanadic acid, vanadium(V) chloride, vanadium (V) alkoxide, nickel(II) chloride, nickel(I) alkoxide, copper (II) acetate, copper(II) alkoxide, molybdenum(V) chloride, molybdenum(V) alkoxide, or a combination thereof. In some embodiments, the Cu(I)-containing material is substantially homogeneously dispersed in the binder.

In some embodiments, the binder is at least about 1% by volume and/or at most about 50% by volume of the hole carrier layer.

In some embodiments, the hole carrier layer has a work function of at least about −6.5 eV and/or at most about −4.8 eV.

In some embodiments, the hole carrier layer has a thickness of at least about 5 nm and/or at most about 500 nm.

In some embodiments, the photoactive layer includes an electron donor material and an electron acceptor material. The electron donor material can include a polymer selected from the group consisting of polythiophenes, polyanilines, polycarbazoles, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide) s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polytetrahydroisoindoles, polyfluorenes, and copolymers thereof. For example, the electron donor material can include a polythiophene or a polycyclopentadithiophene. The electron acceptor material can include a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof. For example, the electron acceptor material can include a substituted fullerene.

Other features, objects, and advantages will be apparent from the description, drawings, and claims.

DESCRIPTION OF DRAWINGS

Like reference symbols in the various drawings indicate like elements.

DETAILED DESCRIPTION

In general, this disclosure relates to a photovoltaic cell that includes a layer having a Cu(I)-containing material. The layer can be used as a hole carrier layer in the photovoltaic cell.

Figure 1:
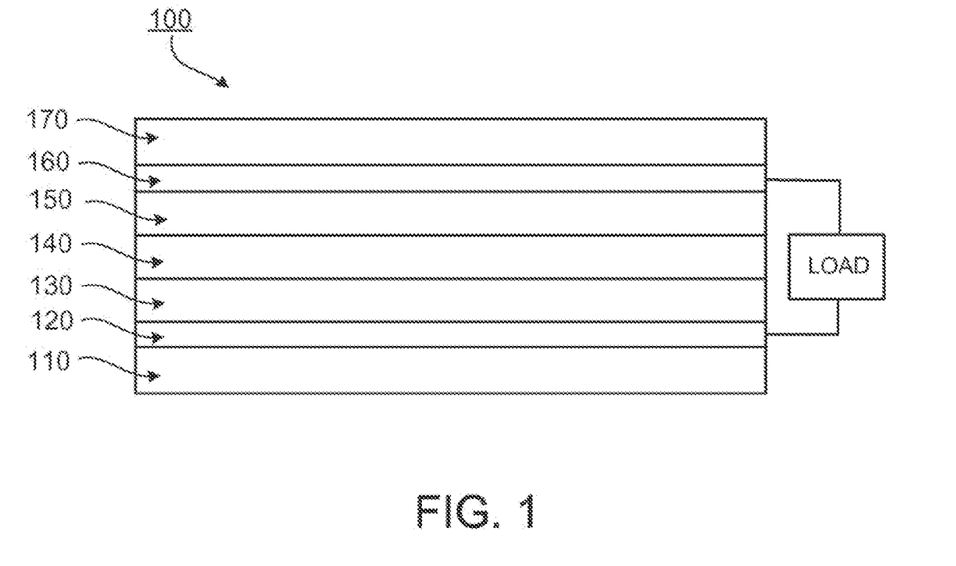
FIG. 1 is a cross-sectional view of an embodiment of a photovoltaic cell.

FIG. 1 shows a cross-sectional view of an exemplary photovoltaic cell 100 that includes a substrate 110, an electrode 120, an optional hole blocking layer 130, a photoactive layer 140 (e.g., containing an electron acceptor material and an electron donor material), a hole carrier layer 150, an electrode 160, and a substrate 170.

In general, during use, light can impinge on the surface of substrate 110, and passes through substrate 110, electrode 120, and optional hole blocking layer 130. The light then interacts with photoactive layer 140, causing electrons to be transferred from the electron donor material (e.g., a conjugated polymer) to the electron acceptor material (e.g., a substituted fullerene). The electron acceptor material then transmits the electrons through optional hole blocking layer 130 to electrode 120, and the electron donor material transfers holes through hole carrier layer 150 to electrode 160. Electrodes 120 and 160 are in electrical connection via an external load so that electrons pass from electrode 120 through the load to electrode 160.

Hole carrier layer 150 generally includes a Cu(I)-containing material. The Cu(I)-containing material can include a Cu(I) oxide, a Cu(I) salt, or a combination thereof. Exemplary Cu(I) oxides include $Cu_2O$ and $Cu_xO$, in which x is a number greater than 1 and less than 2. Exemplary Cu(I) salts include $Cu_2S$, $Cu_2Se$, $Cu_2Te$, CuSCN, CuSeCN, and a combination thereof. In some embodiments, the Cu(I)-containing material is a p-type semiconductor.

Without wishing to be bound by theory, it is believed that the Cu(I)-containing material can be used to replace a conventional acidic hole carrier material (e.g., PEDOT doped with PSS) to provide a photovoltaic cell with a sufficiently high energy conversion efficiency. The photovoltaic cell thus formed includes a non-acidic hole carrier material and therefore can have an improved stability and life span compared to a conventional photovoltaic cell containing an acidic hole carrier material. Further, without wishing to be bound by theory, it is believed that the Cu(I)-containing material can have a sufficiently large hole mobility that enables it to form a hole carrier layer with a large film thickness (e.g., between about 50 nm and about 400 nm). Such a hole carrier layer can minimize shunting (which can cause short circuit) during the production of photovoltaic cells in a large scale. In addition, the Cu(I)-containing material is generally less water sensitive and less expensive than a conventional hole carrier material (e.g., PEDOT doped with PSS). Thus, the Cu(I)-containing material is believed to be superior to known hole carrier materials.

In some embodiments, the Cu(I)-containing material is in the form of nanoparticles. The nanoparticles can have an average diameter of at least about 2 nm (e.g., at least about 5 nm, at least about 10 nm, at least about 20 nm, or at least about 30 nm) and/or at most about 200 nm (e.g., at most about 150 nm, at most about 100 nm, at most about 50 nm, or at most about 30 nm). Without wish to be bound by theory, it is believed that, if the average diameter of the nanoparticles is too small, the Cu(I)-containing material does not have sufficient hole conductivity to function as an effective hole carrier layer. Further, without wishing to be bound by theory, it is believed that, if the average diameter of the nanoparticles is too large, the Cu(I)-containing material may contain large pores and therefore may not function as an effective solvent barrier for the underlying layer during the production of a photovoltaic cell. Preferably, the nanoparticles can have an average diameter between about 10 nm and about 30 nm.

In general, the Cu(I)-containing material can optionally be doped with one or more dopants to adjust the work function of hole carrier layer 150. Examples of suitable dopants include metals (e.g., Ba, Be, Sr, Li, and rare earth metals such as Y, La, and Ln), C60 and its derivatives, C70 and its derivatives, single- and multi-wall nanotubes, and metal oxides (e.g., zinc oxides or titanium oxides).

In some embodiments, hole carrier layer 150 can optionally include a binder. Without wishing to be bound by theory, it is believed that a binder can fill the pores between the nanoparticles in a hole carrier layer and improve the mechanical stability of the hole carrier layer. In general, the Cu(I)-containing material is substantially homogeneously dispersed in the binder in hole carrier layer 150. In addition, the binder generally does not affect the work function of hole carrier layer 150 in a way that it does not match the work functions of its neighboring layers (e.g., being significantly different from the work function of the electron donor material in a photoactive layer). In some embodiments, hole carrier layer 150 containing a binder can have a work function between about $-6.5$ eV and about $-4.8$ eV (e.g., about $-5.0$ eV).

In some embodiments, the binder can include a polymer. Examples of suitable polymers include acrylic resins, ionic polymers, and polymers containing an electron accepting group. In general, the polymer is soluble in an organic solvent (e.g., an alcoholic, nitrile, or aliphatic hydrocarbon solvent).

Exemplary acrylic resins include methyl methacrylate homopolymers and copolymers, ethyl methacrylate homopolymers and copolymers, butyl methacrylate (e.g., n-butyl methacrylate or iso-butyl methacrylate) homopolymers and copolymers. Commercial examples of such acrylic resins include an ELVACITE series of polymers available from Lucite International (Cordova, Tenn.).

In general, ionic polymers suitable for use as a binder can include positive and/or negative groups. Exemplary positive groups include ammonium groups (e.g., tetramethylammonium), phosphonium, and pyridinium. Exemplary negative groups include carboxylate, sulfonate, phosphate, and boronate.

In general, polymers containing an electron accepting group can be fluoro-containing polymers and cyano-containing polymers. Fluoro-containing polymers can be completely or partially fluorinated polymers. Examples of completely fluorinated polymers include poly (hexafluoropropylene), poly(perfluoroalkyl vinyl ether)s, poly(perfluoro-(2,2-dimethyl-1,3-dioxole), and poly(tetrafluoroethylene). Examples of partially fluorinated polymers include poly(vinyl fluoride), poly(vinylidene fluoride), partially fluorinated polysiloxanes, partially fluorinated polyacrylates, and partially fluorinated polymethacrylates, partially fluorinated polystyrenes, and partially fluorinated poly (tetrafluoroethylene) copolymers Commercial examples of fluoro-containing polymers include TEFLON, TEFLON AF, NAFION, and TEDLAR series of polymers available from E.I. du Pont de Nemours and Company (Wilmington, Del.), a KYNAR series of polymers available from Atochem (Philadelphia, Pa.), and a CYTOP series of polymers available from Bellex International Corporation (Wilmington, Del.). Fluorinated ionic polymers (e.g., polymers containing carboxyl, sulfonic acid, phosphonic acid) can also be used as a suitable fluoro-containing polymer for the binder. Other suitable electron accepting groups include π-electron accepting groups (e.g., pentafluoro phenyl and pentafluoro benzoyl) and boronate groups (e.g., pentafluoro phenyl boronate)

In some embodiments, the binder can include a sol gel. Without wishing to be bound by theory, it is believed that a hole carrier layer containing a sol gel as a binder can exhibit excellent mechanical properties and can form a very hard film. Such a layer can serve as an effective solvent barrier for the underlying layer during manufacturing of a photovoltaic cell.

In some embodiments, the sol gel can be a p-type semiconductor (i.e., a p-type sol gel). The p-type sol gel can be formed from a p-type sol, such as those containing vanadic acid, vanadium(V) chloride, vanadium(V) alkoxide, nickel (II) chloride, nickel(II) alkoxide, copper(II) acetate, copper (II) alkoxide, molybdenum(V) chloride, molybdenum(V) alkoxide, or a combination thereof. Without wishing to be bound by theory, it is believed that a p-type sol gel would not significantly change the work function of the Cu(I)-containing material in a way that the hole carrier layer thus formed would not match the work functions of neighboring layers.

In some embodiments, the binder can be at least about 1 vol % (e.g., at least about 2 vol %, at least about 5 vol %, at least about 10 vol %, or at least about 20 vol %) and/or at most about 50 vol % (e.g., at most about 40 vol %, at most about 30 vol %, at most about 25 vol %, or at most about 15 vol %) of hole carrier layer 150.

In general, the work function of hole carrier layer 150 can vary as desired (e.g., depending on the work functions of its neighboring layers in photovoltaic cell 100). In some embodiments, hole carrier layer 150 can have a work function of at least about −6.5 eV (e.g., at least about −6.3 eV, at least about −6.1 eV, at least about −5.9 eV, or at least about −5.7 eV) and/or at most about −4.8 eV (e.g., at most about −5.0 eV, at most about −5.2 eV, at most about −5.4 eV, or at most about −5.6 eV).

In general, the thickness of hole carrier layer 150 (i.e., the distance between the surface of hole carrier layer 150 in contact with photoactive layer 140 and the surface of electrode 160 in contact with hole carrier layer 150) can vary as desired. Typically, the thickness of hole carrier layer 150 can be at least about 5 nm (e.g., at least about 10 nm, at least about 20 nm, at least about 50 nm, at least about 100 nm, or at least about 200 nm) and/or at most about 500 nm (e.g., at most about 400 nm, at most about 300 nm, or at most about 250 nm). Without wishing to be bound by the theory, it is believed that hole carrier layer 150 having a sufficiently large thickness (e.g., from about 50 nm to about 400 nm) can minimize shunting during manufacturing of photovoltaic cells in a large scale.

In general, the method of preparing hole carrier layer 150 can vary as desired. In some embodiments, hole carrier layer 150 can be prepared via a gas phase-based coating process, such as chemical or physical vapor deposition processes. A gas phase-based coating process generally involves evaporating the materials to be coated (e.g., in vacuum) and apply the evaporated materials to a surface (e.g., by sputtering).

In some embodiments, hole carrier layer 150 can be prepared via a liquid-based coating process. The term "liquid-based coating process" mentioned herein refers to a process that uses a liquid-based coating composition. Examples of the liquid-based coating composition include solutions, dispersions, and suspensions. The liquid-based coating process can be carried out by using at least one of the following processes: solution coating, ink jet printing, spin coating, dip coating, knife coating, bar coating, spray coating, roller coating, slot coating, gravure coating, flexographic printing, or screen printing. Examples of liquid-based coating processes have been described in, for example, commonly-owned co-pending U.S. Application Publication No. 2008-0006324. Without wishing to be bound by theory, it is believed that forming hole carrier layer 150 by a liquid-based coating process can result in a film with a sufficiently large thickness. Such a hole carrier layer can minimize shunting during manufacturing of photovoltaic cells in a large scale.

In some embodiments, when hole carrier layer 150 includes a Cu(I)-containing material without a binder, the liquid-based coating process can be carried out by (1) mixing the Cu(I)-containing material (e.g., $Cu_2O$ nanoparticles) with a solvent to form a dispersion, (2) coating the dispersion onto a substrate, and (3) drying the coated dispersion. Exemplary solvents include alcoholic solvents (e.g., methanol, ethanol, n-propanol, i-propanol, n-butanol, i-butanol, t-butanol, and methoxypropanol), nitrile solvents (e.g., acetonitrile, propionitrile, and butyronitrile), ketone solvents (e.g., acetone, methyl ethyl ketone, cyclobutanone, and cyclic lactones), and aliphatic hydrocarbon solvents (e.g., hexane, heptane and octane).

In some embodiments, when hole carrier layer 150 includes a Cu(I)-containing material and a polymer as a binder, the liquid-based coating process can be carried out by (1) mixing the Cu(I)-containing material (e.g., $Cu_2O$ nanoparticles) and the polymer (e.g., an acrylic resin) with a solvent to form a dispersion, (2) coating the dispersion onto a substrate, and (3) drying the coated dispersion. In some embodiments, the Cu(I)-containing material can be dispersed in a first solvent and the polymer can be dissolved in a second solvent (which can be the same as or different from the first solvent) prior to the mixing of the Cu(I)-containing material with the polymer.

In some embodiments, when hole carrier layer 150 includes a Cu(I)-containing material and a sol gel as a binder, the liquid-based coating process can be carried out by (1) mixing the Cu(I)-containing material (e.g., $Cu_2O$ nanoparticles) and a sol-gel precursor (e.g., a vanadium(V) alkoxide) in a suitable solvent to form a dispersion, (2) coating the dispersion on a substrate, (3) hydrolyzing the dispersion to form a sol gel layer containing the Cu(I)-containing material, and (4) drying the sol gel layer.

Turning to other components of photovoltaic cell 100, substrate 110 is generally formed of a transparent material. As referred to herein, a transparent material is a material which, at the thickness used in a photovoltaic cell 100, transmits at least about 60% (e.g., at least about 70%, at least about 75%, at least about 80%, at least about 85%) of incident light at a wavelength or a range of wavelengths used during operation of the photovoltaic cell. Exemplary materials from which substrate 110 can be formed include polyethylene terephthalates, polyimides, polyethylene naphthalates, polymeric hydrocarbons, cellulosic polymers, polycarbonates, polyamides, polyethers, and polyether ketones. In certain embodiments, the polymer can be a fluorinated polymer. In some embodiments, combinations of polymeric materials are used. In certain embodiments, different regions of substrate 110 can be formed of different materials.

In general, substrate 110 can be flexible, semi-rigid or rigid (e.g., glass). In some embodiments, substrate 110 has a flexural modulus of less than about 5,000 megaPascals (e.g., less than about 1,000 megaPascals or less than about 500 megaPascals). In certain embodiments, different regions of substrate 110 can be flexible, semi-rigid, or inflexible (e.g., one or more regions flexible and one or more different regions semi-rigid, one or more regions flexible and one or more different regions inflexible).

Typically, substrate 110 has a thickness at least about one micron (e.g., at least about five microns or at least about 10 microns) and/or at most about 1,000 microns (e.g., at most about 500 microns, at most about 300 microns, at most about 200 microns, at most about 100 microns, or at most about 50 microns).

Generally, substrate 110 can be colored or non-colored. In some embodiments, one or more portions of substrate 110 is/are colored while one or more different portions of substrate 110 is/are non-colored.

Substrate 110 can have one planar surface (e.g., the surface on which light impinges), two planar surfaces (e.g., the surface on which light impinges and the opposite surface), or no planar surfaces. A non-planar surface of substrate 110 can, for example, be curved or stepped. In some embodiments, a non-planar surface of substrate 110 is patterned (e.g., having patterned steps to form a Fresnel lens, a lenticular lens or a lenticular prism).

Electrode 120 is generally formed of an electrically conductive material. Exemplary electrically conductive materials include electrically conductive metals, electrically conductive alloys, electrically conductive polymers, and electrically conductive metal oxides. Exemplary electrically conductive metals include gold, silver, copper, aluminum, nickel, palladium, platinum, and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum, and alloys of titanium. Exemplary electrically conducting polymers include polythiophenes (e.g., doped poly(3,4-ethylenedioxythiophene) (doped PEDOT)), polyanilines (e.g., doped polyanilines), polypyrroles (e.g., doped polypyrroles). Exemplary electrically conducting metal oxides include indium tin oxide, fluorinated tin oxide, tin oxide and zinc oxide. In some embodiments, combinations of electrically conductive materials are used.

In some embodiments, electrode 120 can include a mesh electrode. Examples of mesh electrodes are described in co-pending U.S. Patent Application Publication Nos. 2004-0187911 and 2006-0090791.

In some embodiments, a combination of the materials described above can be used to form electrode 120.

Optionally, photovoltaic cell 100 can include a hole blocking layer 130. The hole blocking layer is generally formed of a material that, at the thickness used in photovoltaic cell 100, transports electrons to electrode 120 and substantially blocks the transport of holes to electrode 120. Examples of materials from which the hole blocking layer can be formed include LiF, metal oxides (e.g., zinc oxide or titanium oxide), and amines (e.g., primary, secondary, or tertiary amines). Examples of amines suitable for use in a hole blocking layer have been described, for example, in co-pending U.S. Application Publication No. 2008-0264488.

Without wishing to be bound by theory, it is believed that, when photovoltaic cell 100 includes a hole blocking layer made of amines, the hole blocking layer can facilitate the formation of ohmic contact between photoactive layer 140 and electrode 120 without being exposed to UV light, thereby reducing damage to photovoltaic cell 100 resulted from UV exposure.

In some embodiments, hole blocking layer 130 can have a thickness of at least about 1 nm (e.g., at least about 2 nm, at least about 5 nm, or at least about 10 nm) and/or at most about 50 nm (e.g., at most about 40 nm, at most about 30 nm, at most about 20 nm, or at most about 10 nm).

Photoactive layer 140 generally contains an electron acceptor material (e.g., an organic electron acceptor material) and an electron donor material (e.g., an organic electron donor material).

Examples of electron acceptor materials include fullerenes, inorganic nanoparticles, oxadiazoles, discotic liquid crystals, carbon nanorods, inorganic nanorods, polymers containing moieties capable of accepting electrons or forming stable anions (e.g., polymers containing CN groups or polymers containing $CF_3$ groups), and combinations thereof. In some embodiments, the electron acceptor material is a substituted fullerene (e.g., a phenyl-C61-butyric acid methyl ester (PCBM-C60) or a phenyl-C71-butyric acid methyl ester (PCBM-C70)). In some embodiments, a combination of electron acceptor materials can be used in photoactive layer 140.

Examples of electron donor materials include conjugated polymers, such as polythiophenes, polyanilines, polycarbazoles, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polyfluorenes, polytetrahydroisoindoles, and copolymers thereof. In some embodiments, the electron donor material can be polythiophenes (e.g., poly(3-hexylthiophene)), polycyclopentadithiophenes, and copolymers thereof. In certain embodiments, a combination of electron donor materials can be used in photoactive layer 140.

Examples of other polymers suitable for use in photoactive layer 140 have been described in, e.g., U.S. Pat. Nos. 7,781,673 and 7,772,485, PCT Application No. PCT/US2011/020227, and U.S. Application Publication Nos. 2010-0224252, 2010-0032018, 2008-0121281, 2008-0087324, 2007-0020526, and 2007-0017571.

Electrode 160 is generally formed of an electrically conductive material, such as one or more of the electrically conductive materials described above with respect to electrode 120. In some embodiments, electrode 160 is formed of a combination of electrically conductive materials. In certain embodiments, electrode 160 can be formed of a mesh electrode.

Substrate 170 can be identical to or different from substrate 110. In some embodiments, substrate 170 can be formed of one or more suitable polymers, such as the polymers used in substrate 110 described above.

In general, the methods of preparing each of layers 120, 130, 140, and 160 in photovoltaic cell 100 can vary as desired. In some embodiments, layer 120, 130, 140, or 160 can be prepared by a gas phase based coating process or a liquid-based coating process, such as those described above.

In some embodiments, when a layer (e.g., layer 120, 130, 140, or 160) includes inorganic semiconductor material, the liquid-based coating process can be carried out by (1) mixing the inorganic semiconductor material with a solvent (e.g., an aqueous solvent or an anhydrous alcohol) to form a dispersion, (2) coating the dispersion onto a substrate, and (3) drying the coated dispersion. In certain embodiments, a liquid-based coating process for preparing a layer containing inorganic metal oxide nanoparticles can be carried out by (1) dispersing a precursor (e.g., a titanium salt) in a suitable solvent (e.g., an anhydrous alcohol) to form a dispersion, (2) coating the dispersion on a substrate, (3) hydrolyzing the dispersion to form a metal oxide nanoparticles layer (e.g., a titanium oxide nanoparticles layer), and (4) drying the metal oxide nanoparticles layer. In certain embodiments, the liquid-based coating process can be carried out by a sol-gel process.

In general, the liquid-based coating process used to prepare a layer (e.g., layer 120, 130, 140, or 160) containing an organic semiconductor material can be the same as or different from that used to prepare a layer containing an inorganic semiconductor material. In some embodiments, to prepare a layer including an organic semiconductor material, the liquid-based coating process can be carried out by mixing the organic semiconductor material with a solvent (e.g., an organic solvent) to form a solution or a dispersion, coating the solution or dispersion on a substrate, and drying the coated solution or dispersion.

In some embodiments, photovoltaic cell 100 can be prepared in a continuous manufacturing process, such as a roll-to-roll process, thereby significantly reducing the manufacturing cost. Examples of roll-to-roll processes have been described in, for example, commonly-owned co-pending U.S. Pat. No. 7,476,278 and U.S. Application Publication No. 2007-0295400.

While certain embodiments have been disclosed, other embodiments are also possible.

In some embodiments, photovoltaic cell 100 includes a cathode as a bottom electrode (i.e., electrode 120) and an anode as a top electrode (i.e., electrode 160). In some embodiments, photovoltaic cell 100 can include an anode as a bottom electrode and a cathode as a top electrode.

In some embodiments, photovoltaic cell 100 can include the layers shown in FIG. 1 in a reverse order. In other words, photovoltaic cell 100 can include these layers from the bottom to the top in the following sequence: a substrate 170, an electrode 160, a hole carrier layer 150, a photoactive layer 140, an optional hole blocking layer 130, an electrode 120, and a substrate 110.

In some embodiments, one of substrates 110 and 170 can be transparent. In other embodiments, both of substrates 110 and 170 can be transparent.

In some embodiments, the Cu(I)-containing material described above can be used in a hole carrier layer in a system in which two photovoltaic cells share a common electrode. Such a system is also known as tandem photovoltaic cell. Exemplary tandem photovoltaic cells have been described in, e.g., co-pending U.S. Application Publication Nos. 2009-0211633, 2007-0181179, 2007-0246094, and 2007-0272296.

Figure 2:
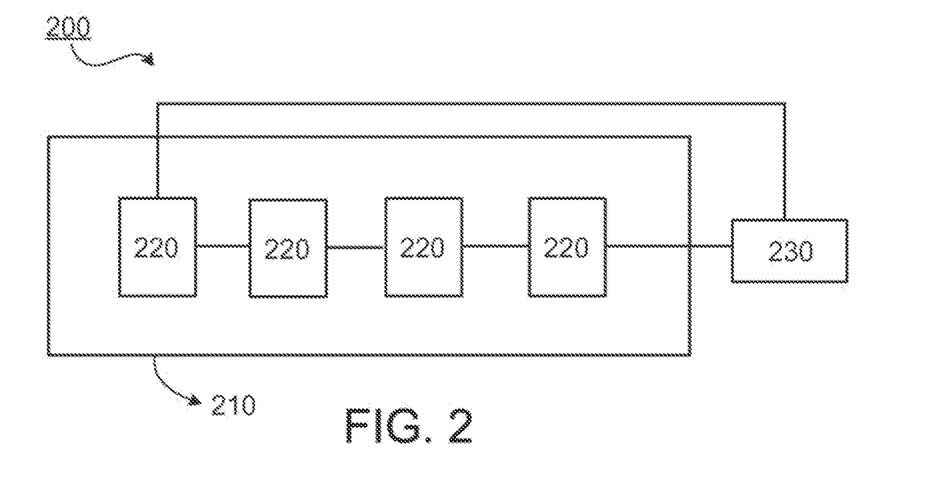
FIG. 2 is a schematic of a system containing multiple photovoltaic cells electrically connected in series.
Figure 3:
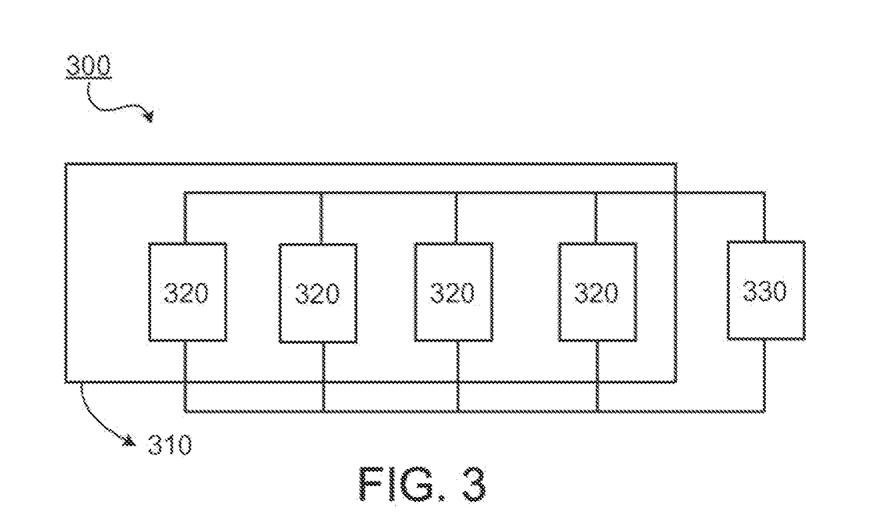
FIG. 3 is a schematic of a system containing multiple photovoltaic cells electrically connected in parallel.

In some embodiments, multiple photovoltaic cells can be electrically connected to form a photovoltaic system. As an example, FIG. 2 is a schematic of a photovoltaic system 200 having a module 210 containing a plurality of photovoltaic cells 220. Cells 220 are electrically connected in series, and system 200 is electrically connected to a load 230. As another example, FIG. 3 is a schematic of a photovoltaic system 300 having a module 310 that contains a plurality of photovoltaic cells 320. Cells 320 are electrically connected in parallel, and system 300 is electrically connected to a load 330. In some embodiments, some (e.g., all) of the photovoltaic cells in a photovoltaic system can be disposed on one or more common substrates. In certain embodiments, some photovoltaic cells in a photovoltaic system are electrically connected in series, and some of the photovoltaic cells in the photovoltaic system are electrically connected in parallel.

While organic photovoltaic cells have been described, other photovoltaic cells can also be prepared based on the Cu(I)-containing material described herein. Examples of such photovoltaic cells include dye sensitized photovoltaic cells and inorganic photoactive cells with a photoactive material formed of amorphous silicon, cadmium selenide, cadmium telluride, copper indium selenide, and copper indium gallium selenide. In some embodiments, a hybrid photovoltaic cell can be integrated with Cu(I)-containing material described herein.

While photovoltaic cells have been described above, in some embodiments, the Cu(I)-containing material described herein can be used in other devices and systems. For example, the Cu(I)-containing material can be used in suitable organic semiconductive devices, such as field effect transistors, photodetectors (e.g., IR detectors), photovoltaic detectors, imaging devices (e.g., RGB imaging devices for cameras or medical imaging systems), light emitting diodes (LEDs) (e.g., organic LEDs (OLEDs) or IR or near IR LEDs), lasing devices, conversion layers (e.g., layers that convert visible emission into IR emission), amplifiers and emitters for telecommunication (e.g., dopants for fibers), storage elements (e.g., holographic storage elements), and electrochromic devices (e.g., electrochromic displays).

The contents of all publications cited herein (e.g., patents, patent application publications, and articles) are hereby incorporated by reference in their entirety.

The following example is illustrative and not intended to be limiting.

EXAMPLE 1

Fabrication of Photovoltaic Cells Having a Hole Carrier Layer Containing $Cu_2O$ Nanoparticles and an ELVACITE Polymer Photovoltaic cells having a hole carrier layer containing either PEDOT (as a control) or a combination of $Cu_2O$ nanoparticles and an ELVACITE polymer were prepared as follows:

Indium-tin-oxide coated plastic substrates were cut into squares having a 2"×2" size and structured into conducting electrode stripes. The substrates were cleaned by ultrasonicating in isopropanol (IPA) for 10 minutes. The substrates were subsequently dried using an air-gun and coated with a titanium alkoxide sol (which contained 0.1 M titanium tetrabutoxide in isopropanol) using blade coating at 80° C. The titanium alkoxide film was then dried at 80° C. for 2 minutes and annealed at 120° C. for 10 minutes to form a TiOx layer as a hole blocking layer. A photoactive layer was formed by blade coating a 2.5% solution containing 1:1 weight ratio of an electron donor material and an electron accept material in o-xylene on the TiOx layer at 65° C. The electron donor material was a mixture of poly(3-hexyl thiophene) (P3HT) (available from BASF, Basel, Switzerland) and a poly(cyclopentadithiophene-co-silacyclopenta-dithiophene-co-benzothiadiazole) (available from Konarka Technologies, Inc., Lowell, Mass.) at a 2:1 weight ratio. The electron acceptor material was C60-PCBM (available from Solenne BV (Groningen, The Netherlands). The film was then dried at 65° C. for 5 minutes to form the photoactive layer. A hole carrier layer was coated on the photoactive layer using a blade coater at different blading temperatures and different coating speeds. After drying, the entire stack of coatings were annealed at 140° C. for 5 minutes and a 100 Å silver layer was coated on the hole carrier layer using vacuum evaporation to form an electrode.

Seven types of photovoltaic cells were prepared using the above procedure: Photovoltaic cells (1) and (2) included a hole carrier layer made by coating PEDOT/PSS at a coating speed of 40 mm/sec at 80° C. and at a coating speed of 7.5 mm/sec at 65° C., respectively. Photovoltaic cells (3) included a hole carrier layer made by coating a dispersion containing 0.5 wt % $Cu_2O$ nanoparticles and 0.25 wt % an ELVACITE-2013 polymer (Lucite Internation, Cordova, Tenn.) in butanol at 80° C. at a coating speed of 10 mm/sec. Photovoltaic cells (4) included a hole carrier layer made by coating a dispersion containing 1 wt % $Cu_2O$ nanoparticles and 0.5 wt % the ELVACITE-2013 polymer in butanol at 80° C. at a coating speed of 20 mm/sec. Photovoltaic cells (5) included a hole carrier layer made by coating a dispersion containing 0.5 wt % $Cu_2O$ nanoparticles and 0.25 wt % an ELVACITE polymer in 1:1 butanol-IPA at 65° C. at a coating speed of 40 mm/sec.

The performance of the photovoltaic cells thus formed was measured using a solar simulator under AM 1.5 conditions. The results are summarized in Table 1. The values listed in Table 1 are average results based on measurements from 2-4 cells.

TABLE 1

| Photovoltaic cell | Hole carrier layer/coating temperature | $J_{sc}$ (mA/cm$^2$) | $V_{oc}$ (V) | FF | Efficiency (%) |
|---|---|---|---|---|---|
| (1) | PEDOT:PSS/80° C. | 7.849 | 0.575 | 0.620 | 2.793 |
| (2) | PEDOT:PSS/65° C. | 9.349 | 0.563 | 0.547 | 2.877 |
| (3) | 0.5 wt % $Cu_2O$:0.25 wt % ELVACITE/80° C. | 8.292 | 0.520 | 0.470 | 2.055 |
| (4) | 1.0 wt % $Cu_2O$:0.5 wt % ELVACITE/80° C. | 9.742 | 0.545 | 0.555 | 2.955 |
| (5) | 0.5 wt % $Cu_2O$:0.25 wt % ELVACITE/65° C. | 10.302 | 0.555 | 0.530 | 3.045 |

As shown in Table 1, photovoltaic cells (3)-(7) exhibited efficiencies similar to photovoltaic cells (1) and (2).

EXAMPLE 2

Fabrication of Photovoltaic Cells Having a Hole Carrier Layer Containing $Cu_2O$ Nanoparticles without a Polymer or with Different Types of Polymers Four types of photovoltaic cells were prepared following the procedure described in Example 1: Photovoltaic cells (1) included a hole carrier layer containing PEDOT/PSS as a control. Photovoltaic cells (2) included a hole carrier layer made from a dispersion containing only 0.5 wt % $Cu_2O$ nanoparticles in IPA (i.e., without containing any polymer). Photovoltaic cells (3) included a hole carrier layer made from a dispersion containing 2.0 wt % $Cu_2O$ nanoparticles and 0.2 wt % of an ELVACITE polymer in methoxypropanol. Photovoltaic cells (4) included a hole carrier layer made from a dispersion containing 2.0 wt % $Cu_2O$ nanoparticles and 0.33 wt % of a NAFION polymer in methoxypropanol. All types of photovoltaic cells were produced at a blading temperature of both 65° C. and 80° C.

The performance of the photovoltaic cells thus formed was measured using a solar simulator under AM 1.5 conditions. The results are summarized in Table 2. The values listed in Table 2 are average results based on measurements from four cells.

TABLE 2

| Photovoltaic cell | $J_{sc}$ (mA/cm$^2$) | $V_{oc}$ (V) | FF | Efficiency (%) |
|---|---|---|---|---|
| Blading Temperature = 65° C. | | | | |
| (1) | 10.72 | 0.545 | 0.57 | 3.30 |
| (2) | 9.77 | 0.540 | 0.55 | 2.88 |
| (3) | 9.56 | 0.540 | 0.54 | 2.81 |
| (4) | 10.64 | 0.540 | 0.53 | 3.03 |
| Blading Temperature = 80° C. | | | | |
| (1) | 10.32 | 0.548 | 0.56 | 3.18 |
| (2) | 9.47 | 0.540 | 0.56 | 2.84 |
| (3) | 9.29 | 0.540 | 0.56 | 2.79 |
| (4) | 10.61 | 0.537 | 0.54 | 3.05 |

As shown in Table 2, photovoltaic cells (2)-(4) exhibited photovoltaic properties similar to photovoltaic cell (1).

EXAMPLE 3

Hole Carrier Layers Containing $Cu_2O$ Nanoparticles and Various Different Polymer Binders Coatings that can be used as hole carrier layers were prepared by using dispersions containing $Cu_2O$ nanoparticles alone or in the presence of the following binders at a 20/3 weight ratio in butanol: (1) Disperbyk-190 available from BYK-Chemie GmbH (Wesel, Germany), (2) Solplus D540 available from Lubrizol Advanced Materials (Cleveland, Ohio), (3) a sol gel prepared from AB 111446 (i.e., perfluorooctyltriethoxy-silane available from ABCR GmbH & Co. KG, Karlsruhe, Germany), and (4) Zusoplast 9002 (i.e., a polyethylene glycol 200 available from Zschimmer & Schwarz, Lahnstein, Germany). The thickness, conductivity, and work function of the dried coatings were measured and were summarized in Table 3.

TABLE 3

| Sample | Dispersing Additive | Thickness (nm) | Conductivity (S/cm) | Work Function (eV) |
|---|---|---|---|---|
| (I) | Disperbyk-190 | 205 | $1 \times 10^{-6}$ | −4.4 |
| (II) | Disperbyk-190 | 197 | $1 \times 10^{-6}$ | −4.4 |
| (III) | Disperbyk-190 | 300 | $1 \times 10^{-6}$ | −4.4 |
| (IV) | Solplus D540 | 148 | $2 \times 10^{-7}$ | −4.4 |
| (V) | AB 111446 sol gel | 402 | $8 \times 10^{-8}$ | −5.15 |
| (VI) | Zusoplast 9002 | N/A | $1 \times 10^{-7}$ | −4.35 |
| (VII) | No binder | N/A | $7 \times 10^{-8}$ | −4.95 |

The results showed that samples (V) and (VII) exhibited a work function similar to that of P3HT (i.e., about −5 eV).

EXAMPLE 4

Fabrication of Photovoltaic Cells Containing the Hole Carrier Layers in Example 3

Photovoltaic cells containing the hole carrier layers based on Disperbyk-190 and AB 111446 sol gel described in Example 3 were prepared following the procedure described in Example 1. The performance of the photovoltaic cells thus formed was measured using a solar simulator under AM 1.5 conditions.

The results showed that photovoltaic cells containing a hole carrier layer based on AB 111446 sol gel exhibited superior performance compared to photovoltaic cells containing a hole carrier layer based on Disperbyk-190. Without wishing to be bound by theory, it is believed that the superior performance exhibited by the former type of photovoltaic cells is due to the work function of the hole carrier layer containing AB 111446 sol gel is closer to the work functions of P3HT in the photoactive layer than the hole carrier layer containing Disperbyk-190.

Other embodiments are in the claims.

What is claimed is:

1. An article, comprising:
   first and second electrodes,
   a photoactive layer between the first and second electrodes, and
   a hole carrier layer between the first electrode and the photoactive layer, the hole carrier layer comprising a Cu(I)-containing material and a binder, wherein the binder is a sol gel or a polymer selected from the group consisting of an acrylic resin, an ionic polymer, or a polymer containing an electron accepting group, wherein the Cu(I)-containing material is substantially homogeneously dispersed in the binder, wherein the hole carrier layer has a thickness of at most about 500 nm, wherein the binder is at most about 50% by volume of the hole carrier layer and wherein the article is configured as a photovoltaic cell.

2. The article of claim 1, wherein the binder is at least about 1% by volume of the hole carrier layer.

\* \* \* \* \*